United States Patent [19]

Hartmann et al.

[11] 4,357,414

[45] Nov. 2, 1982

[54] LAMINATE USEFUL FOR THE PRODUCTION OF PRINTING PLATES AND RELIEF PLATES

[75] Inventors: Heinrich Hartmann, Limburgerhof; Gerhard Hoffmann, Otterstadt; Werner Lenz, Bad Durkheim, all of Fed. Rep. of Germany

[73] Assignee: BASF Aktiengesellschaft, Fed. Rep. of Germany

[21] Appl. No.: 249,705

[22] Filed: Mar. 31, 1981

[30] Foreign Application Priority Data

Apr. 22, 1980 [DE] Fed. Rep. of Germany ....... 3015340

[51] Int. Cl.³ .......................... G03C 1/68; G03C 1/70
[52] U.S. Cl. ..................... 430/275; 430/271; 430/281; 430/300; 430/306; 430/284; 430/286
[58] Field of Search ............... 430/271, 281, 275, 300, 430/306, 905, 939, 523, 524

[56] References Cited

U.S. PATENT DOCUMENTS 3,654,021 4/1972 Henkler ............................ 156/331
3,877,939 4/1975 Okai .

FOREIGN PATENT DOCUMENTS 786199 11/1957 United Kingdom .
834337 5/1960 United Kingdom .
835849 5/1960 United Kingdom .
1233883 6/1971 United Kingdom .
1351475 5/1974 United Kingdom .
1416440 12/1975 United Kingdom .

Primary Examiner—Jack P. Brammer
Attorney, Agent, or Firm—Keil & Witherspoon

[57] ABSTRACT

A laminate suitable for the production of printing plates and relief plates, and possessing a photosensitive layer, which is soluble in water or in an aqueous solution, and contains a hydrophilic polymeric binder, applied to a base, contains, between the base and the photosensitive layer, an intermediate layer which consists of a mixture of a polymeric binder compatible with the polymeric binder of the photosensitive layer, and a diacrylate or dimethacrylate monomer which contains urethane groups and is obtained by reacting a hydroxyalkyl acrylate or hydroxyalkyl methacrylate with a diisocyanate. After application to the base, the intermediate layer is cured at 110°–220° C. before the photosensitive layer is applied.

6 Claims, No Drawings

LAMINATE USEFUL FOR THE PRODUCTION OF PRINTING PLATES AND RELIEF PLATES

The present invention relates to a laminate which is useful for the production of printing plates and relief plates and which exhibits improved stability on processing, especially on drying and after-exposure.

Laminates which are useful for the production of photopolymer printing plates and relif plates and can be developed with water or aqueous solutions are known per se, and a large number of such laminates have been described (cf., for example, British Pat. No. 834,337 or U.S. Pat. No. 3,877,939). On processing such water-soluble photopolymer printing plates and relief plates, after-treatment of the plate, i.e. especially drying and after-exposure, causes plate defects in the form of delamination of the photopolymer layer from the base. This damage, which occurs particularly when drying is effected with infrared lamps, manifests itelf in all parts of the relief, i.e. in solid and half-tone areas, and in line and dot elements. Such damage arises even under after-treatment and drying conditions which do not adequately harden the relief. This means that in order to achieve the required quality of the photopolymer layers, the after-treatment conditions would have to be made more severe in respect of temperature, drying time and radiant intensity. The damage caused by drying frequently makes the plates unusable. On the other hand, plates which are produced under milder conditions and hence without such damage cannot give good printed copies and long runs.

It is an object of the present invention to provide photopolymeric laminates which can be developed with water or with an aqueous solution and which contain one or more hydrophilic polymeric binders in the photosensitive layer, which laminates can be dried, in particular with infrared radiation, without such damage occurring, even under the more severe after-treatment conditions which are required to achieve good plate characteristics.

We have found that this object is achieved and that laminates suitable for the production of printing plates and relief plates, and possessing (a) a photosensitive layer of a mixture, soluble in water or in an aqueous solution, of
  ($a_1$) one or more hydrophilic polymeric binders, together with
  ($a_2$) one or more photopolymerizable ethylenically unsaturated monomers compatible therewith, and
  ($a_3$) a photoinitiator which can be activated by actinic light,
(b) a dimensionally stable base, and
(c) a thin intermediate layer between layers (a) and (b), which is formed from a mixture containing
  ($c_1$) one or more polymeric binders compatible with the polymeric binder ($a_1$) of layer (a), and
  ($c_2$) one or more photopolymerizable ethylenically unsaturated monomers compatible therewith, with or without ($c_3$) a photoinitiator which can be activated by actinic light, substantially show the desired properties if the mixture forming the intermediate layer (c) contains a monomer ($c_2$) of the formula

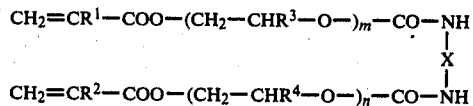

where $R^1$, $R^2$, $R^3$ and $R^4$, which may be identical or different, are each H or $C_1$–$C_8$-alkyl, X is $C_2$–$C_7$-alkylene, a divalent aromatic $C_6$–$C_{10}$ hydrocarbon radical or isophoronylene, and m and n are each integers from 1 to 4 and may be identical or different, and the intermediate layer (c), after application to the base (b), is cured at from 110° to 220° C.

The laminate possessing the novel intermediate layer, after imagewise exposure to actinic light and subsequent washout of the unexposed areas, gives printing plates and relief plates which on after-treatment show no damage due to drying.

The photosensitive layer (a) is formed from a mixture, soluble in water or in an aqueous solution, of ($a_1$) one or more hydrophilic polymeric binders, ($a_2$) one or more photopolymerizable ethylenically unsaturated monomers compatible therewith and ($a_3$) a photoinitiator; such a mixture may be, for example, one of these described in British Pat. Nos. 786,199, 834,337, 835,849, 1,233,883, 1,351,475 and 1,416,440, which are incorporated herein by reference, preferred hydrophilic polymeric binders ($a_1$) being a water-soluble polyvinyl alcohol and its water-soluble copolymers and derivatives, for example its esters, ethers and acetals. Particularly suitable monomers ($a_2$) have proved to be hydroxyl-containing acrylates and methacrylates, eg. hydroxyethyl acrylate, hydroxyethyl methacrylate, and monoacrylates, diacrylates, monomethacrylates and dimethacrylates of aliphatic glycols, eg. of ethylene glycol, butane-1,4-diol, diethylene glycol and polyethylene glycols having molecular weight of up to about 500.

Suitable polymeric binders ($c_1$) for use in the intermediate layer (c) are those which are compatible with the polymeric binder in the layer (a). Preferred binders are polyvinyl alcohol, vinyl alcohol copolymers and their water-soluble derivatives, especially of the type which may also be present as polymeric binders in the photosensitive layer (a).

The mixture which forms the intermediate layer (c) contains, according to the invention, a monomer ($c_2$) of the formula given above, preferably in an amount of from 1 to 25% by weight, based on the sum of the amounts of ($c_1$) and ($c_2$). Preferably, the radicals $R^1$, $R^2$, $R^3$ and $R^4$ in this formula are hydrogen, methyl, ethyl, propyl or butyl, especially hydrogen, methyl or ethyl. X in the formula is in particular hexamethylene, toluylene or isophoronylene. Preferred monomers of this type are reaction products of 2 moles of β-hydroxyethyl acrylate or methacrylate or β-hydroxypropyl acrylate or methacrylate with 1 mole of hexamethylene diisocyanate, toluylene diisocyanate or isophorone diisocyanate, but, for example, reaction products of diethylene glycol monoacrylate or monomethacrylate or triethylene glycol monoacrylate or monomethacrylate with corresponding diisocyanates may also be used.

If a photoinitiator is added to the intermediate layer (c), its amount is from 0.1 to 10% by weight and preferably from 0.5 to 5% by weight, based on the total amount of the components of the intermediate layer (c). Any of the conventional photoinitiators may be used for this purpose.

The mixture which forms the intermediate layer (c) is applied, by conventional methods, to the dimensionally stable base (b), in an amount such that the thickness of the intermediate layer (c), after curing at from 110° to 220° C., especially at from 140° to 170° C., is advantageously from 2 to 30 μm and especially from 5 to 10 μm, the preferred curing timing being from 3 to 10 minutes.

Suitable dimensionally stable bases (b) are in particular the conventional metal supports used in the production of relief plates and printing plates, such as steel or aluminum sheets, they may be pre-treated in a conventional manner, either mechanically or chemically, or provided with an adhesive layer. Steel sheets which have been coated from 10 to 40 μm, especially from 15 to 25 μm, of an adhesive as described in German Laid-Open Application DOS No. 1,597,515 are particularly suitable.

If desired, a protective cover sheet, for example consisting of polyester, may additionally be applied, in a conventional manner, over the photosensitive layer (a) of the novel laminate and, if present, can be stripped off, as appropriate, either before or after exposure of the laminate to actinic light.

In the Example and Comparative Experiments which follow, parts and percentages are by weight, unless stated otherwise. Parts bear the same relation to parts by volume as the kilogram to the liter.

EXAMPLE 1

1.1 A solution is prepared from 44% of water, 44% of methanol, 11.04% of a partially hydrolyzed polyvinyl acetate (degree of hydrolysis 82 mole %, average molecular weight 25,000), 0.72% of a reaction product of 1 mole of toluylene diisocyanate with 2 moles of β-hydroxyethyl methacrylate is monomer ($c_2$) and 0.24% of benzoin ethyl ether. The solution is applied to a steel sheet which has been coated with a polyurethane adhesive according to German Laid-Open Application DOS No. 1,597,515 (prepared from a commercial hydroxyl-containing polyester, obtained from 2.5 moles of adipic acid, 0.5 mole of phthalic acid and 4 moles of 1,1,1-trimethylolpropane, by reaction with a triisocyanate prepared by reacting 3 moles of toluylene diisocyanates with 1 mole of 1,1,1-trimethylolpropane), the amount of solution applied to the sheet being such that, after curing for 7 minutes in a cabinet dryer at 150° C., a 10 μm thick intermediate layer (c) results.

1.2 To prepare the photosensitive layer (a), 294 parts of a partially hydroylzed polyvinyl acetate (degree of hydrolysis 82 mole %, average molecular weight 25,000) are dissolved in 294 parts of water by stirring for several hours at 90° C. When the mixture has cooled to 70° C., a mixture of 180 parts of 2-hydroxyethyl methacrylate and 20 parts of 1,1,1-trimethylolpropane triacrylate are added, as well as 10 parts of benzil dimethylketal and 2 parts of 2,6-di-tert.-butyl-p-cresol, whilst stirring. The homogeneous, viscous solution is filtered and degassed under reduced pressure. It is then applied in a layer to a 125 μm thick polyester film (which later acts as the cover sheet), in such an amount that after 24 hours' drying at room temperature at 550 μm thick non-tacky layer (a) results.

1.3 After moistening the layer (a) and the intermediate layer (c) with a water-methanol mixture, the two-layer element prepared as described in 1.2 is laminated onto the steel plate which has been provided with the intermediate layer (c) as described in 1.1, layer (a) being against layer (c); the polyester cover sheet is then stripped off.

The resulting laminate is exposed imagewise. The unexposed areas of the layers (a) and (c) are then washed out and the resulting relief plate is dried in an after-treatment apparatus, provided with infrared heater bars, for 2.5 minutes at 90° C. (the circulating air temperature indicated by the temperature sensor in the apparatus is less than the temperature of the relief plate surface), following which it is after-exposed.

The relief plate produced in this way has a flawless relief image and is highly suitable as a printing plate.

COMPARATIVE EXPERIMENT A

The procedure followed is exactly as described in Example 1, except that in the solution for the preparation of the intermediate layer (c), 0.72% of β-hydroxyethyl methacrylate is used instead of the reaction product of toluylene diisocyanate and β-hydroxyethyl methacrylate. Following the after-treatment of the developed plate, carried out exactly as described in Example 1.3, the resulting relief plate is found to exhibit serious damage and is unusable as a letterpress printing plate.

COMPARATIVE EXPERIMENT B

The procedure followed is exactly as described in Example 1, except that the solids content of the solution used to prepare the intermediate layer (c) according to 1.1 consists of 86% of the specified polyvinyl alcohol, 12% of tetraethylene glycol dimethacrylate and 2% of benzoin methyl ether. The relief plates, which are otherwise produced and after-treated exactly as described in Example 1, exhibit distinct damage to the relief image and are of no use as printing plates.

We claim:
1. A laminate suitable for the production of printing plates and relief plates, comprising
 (a) a photosensitive layer of a mixture, soluble in water or in an aqueous solution, of
 ($a_1$) at least one hydrophilic polymeric binder, together with
 ($a_2$) at least one photopolymerizable ethylenically unsaturated monomer compatible therewith, and
 ($a_3$) a photoinitiator which can be activated by actinic light,
 (b) a dimensionally stable base, and
 (c) a thin intermediate layer between layers (a) and (b), which is substantially formed from a mixture containing
 ($c_1$) at least one polymeric binder which is compatible with the polymeric binder ($a_1$) of the layer (a), and
 ($c_2$) at least one photopolymerizable ethylenically unsaturated monomer, compatible with ($c_1$), of the formula

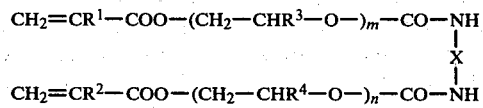

where $R^1$, $R^2$, $R^3$ and $R^4$ may be identical or different and each is H or $C_1$–$C_8$-alkyl, X is $C_2$–$C_7$-alkylene, a divalent aromatic $C_6$–$C_{10}$-hydrocarbon radical or isophoronylene, and m and n are each integers from 1 to 4 and may be identical or different, the intermediate layer being formed by applying the mixture to the base and then curing it at from 110° to 220° C.

2. A laminate as claimed in claim 1, wherein the monomer $(c_2)$ present in the mixture which forms the intermediate layer (c) is a reaction product of 2 moles of β-hydroxyethyl acrylate or methacrylate or β-hydroxypropyl acrylate or methacrylate with 1 mole of hexamethylene diisocyanate, toluylene diisocyanate or isophorone diisocyanate.

3. A laminate as claimed in claim 1, wherein the mixture which forms the intermediate layer (c) contains a water-soluble vinyl alcohol polymer as the polymeric binder $(c_1)$.

4. A laminate as claimed in claim 1 or 2, wherein the mixture which forms the intermediate layer (c) contains from 1 to 25% by weight of the monomer $(c_2)$, based on the mixture of $(c_1)$ and $(c_2)$.

5. A laminate as claimed in claim 1 or 2, wherein the intermediate layer (c) is formed from a mixture of 75–99% by weight of a water-soluble vinyl alcohol polymer as the polymeric binder $(c_1)$ and from 1 to 25% by weight of the monomer $(c_2)$, the percentages being based on the mixture of $(c_1)$ and $(c_2)$.

6. A laminate as claimed in claim 1, 2 or 3, wherein the base (b) is a metal support which has been pretreated mechanically or chemically or provided with an adhesive layer.

* * * * *